United States Patent
Kudo et al.

(10) Patent No.: US 11,698,397 B2
(45) Date of Patent: Jul. 11, 2023

(54) POWER CALCULATION APPARATUS AND POWER CALCULATION METHOD

(71) Applicant: Honda Motor Co., Ltd., Tokyo (JP)

(72) Inventors: Jun Kudo, Wako (JP); Hiroyuki Kanazawa, Wako (JP); Takayuki Sakurai, Wako (JP); Ayano Otogasako, Wako (JP); Thomas Stephen Pontefract, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 289 days.

(21) Appl. No.: 17/211,327

(22) Filed: Mar. 24, 2021

(65) Prior Publication Data
US 2021/0302481 A1 Sep. 30, 2021

(30) Foreign Application Priority Data
Mar. 27, 2020 (JP) .............................. JP2020-058022

(51) Int. Cl.
*G01R 21/133* (2006.01)
*G01R 31/387* (2019.01)
(Continued)

(52) U.S. Cl.
CPC ............ *G01R 21/133* (2013.01); *B60L 53/62* (2019.02); *B60L 58/12* (2019.02); *G01R 31/007* (2013.01);
(Continued)

(58) Field of Classification Search
CPC .. G01R 21/133; G01R 31/007; G01R 31/387; B60L 53/62; B60L 58/12; B60L 2240/62; B60L 2260/50; H02J 3/003; H02J 3/004; H02J 3/322; H02J 2310/48; Y02E 60/00; Y02T 10/70; Y02T 10/7072; Y02T 10/72; Y02T 90/12; Y02T 90/14
See application file for complete search history.

(56) References Cited

U.S. PATENT DOCUMENTS 6,034,443 A * 3/2000 Oliemuller ............ H02J 9/061
307/64
6,636,784 B1 * 10/2003 Tanner, Jr. ............ H02J 3/008
700/287
(Continued)

FOREIGN PATENT DOCUMENTS

WO 2015019585 A1 2/2015

OTHER PUBLICATIONS

Electric Power Transmission; Wikipedia; Aug. 12, 2021.
European Search Report; Application EP21164638; dated Aug. 24, 2021.

*Primary Examiner* — Tung S Lau
(74) *Attorney, Agent, or Firm* — Duft & Bornsen, PC (57) ABSTRACT

A power calculation apparatus calculating an amount of power suppliable to a power system by an energy source connectable, at a connection point, to the power system and capable of power generation and power storing, the power calculation apparatus includes: a microprocessor and a memory connected to the microprocessor, wherein the microprocessor is configured to perform: specifying a position of the connection point of the energy source in connection with the power system; acquiring a capacity information indicating a power generation capacity or a remaining storage capacity of the energy source; and calculating an amount of power suppliable by the energy source to the power system in an area within a predetermined range including the connection point, based on the capacity information and the position of the connection point.

15 Claims, 6 Drawing Sheets

(51) Int. Cl.
  *B60L 53/62* (2019.01)
  *B60L 58/12* (2019.01)
  *H02J 3/32* (2006.01)
  *H02J 3/00* (2006.01)
  *G01R 31/00* (2006.01)

(52) U.S. Cl.
  CPC ............ *G01R 31/387* (2019.01); *H02J 3/003* (2020.01); *H02J 3/004* (2020.01); *H02J 3/322* (2020.01); *H02J 2310/48* (2020.01)

(56) References Cited

U.S. PATENT DOCUMENTS

| | | | | |
|---|---|---|---|---|
| 8,673,514 B2* | 3/2014 | Igarashi | ................ | H02M 3/158 |
| | | | | 429/432 |
| 2004/0251789 A1* | 12/2004 | Sakai | ..................... | H02N 2/181 |
| | | | | 310/339 |
| 2009/0134717 A1* | 5/2009 | Marks | ................... | H02J 15/006 |
| | | | | 307/149 |
| 2010/0291445 A1* | 11/2010 | Igarashi | ................. | B60L 1/003 |
| | | | | 429/428 |
| 2011/0202192 A1 | 8/2011 | Kempton | | |
| 2012/0173059 A1* | 7/2012 | Andris | .................... | B60L 50/15 |
| | | | | 903/903 |
| 2012/0217805 A1* | 8/2012 | De Chabris | .......... | H02J 15/006 |
| | | | | 307/44 |
| 2012/0249068 A1 | 10/2012 | Ishida | | |
| 2012/0326510 A1* | 12/2012 | Sadler | .................... | B60L 50/16 |
| | | | | 307/46 |
| 2014/0072838 A1* | 3/2014 | Imanishi | ................ | B60L 58/40 |
| | | | | 429/429 |
| 2015/0333544 A1* | 11/2015 | Toya | .................... | H01M 10/48 |
| | | | | 320/112 |
| 2017/0306588 A1* | 10/2017 | Bystedt | ................... | E02F 9/205 |
| 2019/0232900 A1* | 8/2019 | Teng | ...................... | B62K 11/00 |

\* cited by examiner

POWER CALCULATION APPARATUS AND POWER CALCULATION METHOD

CROSS-REFERENCE TO RELATED APPLICATION

This application is based upon and claims the benefit of priority from Japanese Patent Application No. 2020-058022 filed on Mar. 27, 2020, the content of which is incorporated herein by reference.

BACKGROUND OF THE INVENTION

Field of the Invention

This invention relates to a power calculation apparatus and a power calculation method predicting and calculating an amount of power suppliable to a power grid.

Description of the Related Art

As such an apparatus of this type, a conventionally known apparatus calculates the amount of power suppliable to a power system from factories and various facilities, and controls the supply-and-demand balance of power based on the calculated amount of power (see, for example, WO2015/019585A1).

Meanwhile, during power transmission from the supply source to the supply destination via the power grid, power loss occurs due to, for example, the resistance of the electric cable. Thus, as described in WO2015/019585A1, if the amount of power suppliable to the power system is simply calculated without considering such power loss, it is difficult to acquire a calculation result with desired accuracy.

SUMMARY OF THE INVENTION

An aspect of the present invention is a power calculation apparatus calculating an amount of power suppliable to a power system by an energy source connectable, at a connection point, to the power system and capable of power generation and power storing. The power calculation apparatus includes a microprocessor and a memory connected to the microprocessor, wherein the microprocessor is configured to perform: specifying a position of the connection point of the energy source in connection with the power system; acquiring a capacity information indicating a power generation capacity or a remaining storage capacity of the energy source; and calculating an amount of power suppliable by the energy source to the power system in an area within a predetermined range including the connection point, based on the capacity information and the position of the connection point.

Another aspect of the present invention is a power calculation method calculating an amount of power suppliable to a power system by an energy source connectable, at a connection point, to the power system and capable of power generation and power storing. The power calculation method includes: specifying a position of the connection point of the energy source in connection with the power system; acquiring a capacity information indicating a power generation capacity or a remaining storage capacity of the energy source; and calculating an amount of power suppliable by the energy source to the power system in an area within a predetermined range including the connection point, based on the capacity information and the position of the connection point.

BRIEF DESCRIPTION OF THE DRAWINGS

The objects, features, and advantages of the present invention will become clearer from the following description of embodiments in relation to the attached drawings, in which.

DETAILED DESCRIPTION

An embodiment of the present invention will be described below with reference to FIGS. 1 to 7. A power calculation apparatus according to the embodiment of the present invention is an apparatus provided between a predetermined energy source capable of generating or storing power, especially a battery mounted on a vehicle such as an electric vehicle (EV), and a power grid, and calculates power for transfer between the predetermined energy source and the power grid. Hereinafter, the power grid may be simply referred to as a grid. In addition, in the following, when simply expressed as a vehicle, the vehicle means an EV.

Recently, the effective utilization of renewable energy has been promoted due to the increase in greenhouse gas emissions. As one of the effective utilizations, a Vehicle to Grid (V2G) system has been proposed, in which EVs are connected to a power grid and the energy stored in the batteries mounted on the EVs is utilized effectively.

In such a V2G system, the EVs not only receive power supply from the grid to charge the batteries, but also supply the power stored in the batteries to the grid, resulting in making the batteries function as if the batteries were one of the power storage facilities in a commercial power grid. As described above, in the V2G system, not only one-way power supply from the power grid to the EVs, but also two-way power transfer including power supply from the EVs to the power grid are performed.

Meanwhile, in order to determine whether or not a bid for the power stored in the battery mounted on the EV (hereinafter, referred to as on-vehicle battery) can be made, it is necessary to calculate accurately the amount of power suppliable by the on-vehicle battery (hereinafter, referred to as the amount of suppliable power). However, during transmission of power supplied from the on-vehicle battery, to the supply destination via the power grid, power loss occurs due to, for example, the resistance of the electric cable.

Therefore, the power calculation apparatus according to the present embodiment calculates the amount of suppliable power of the EV (on-vehicle battery), in consideration of the position of the EV and the range in which the power of the on-vehicle battery is suppliable. Note that the range in which the power is suppliable is an assumed range in which power is suppliable without being affected by power loss.

Figure 1:
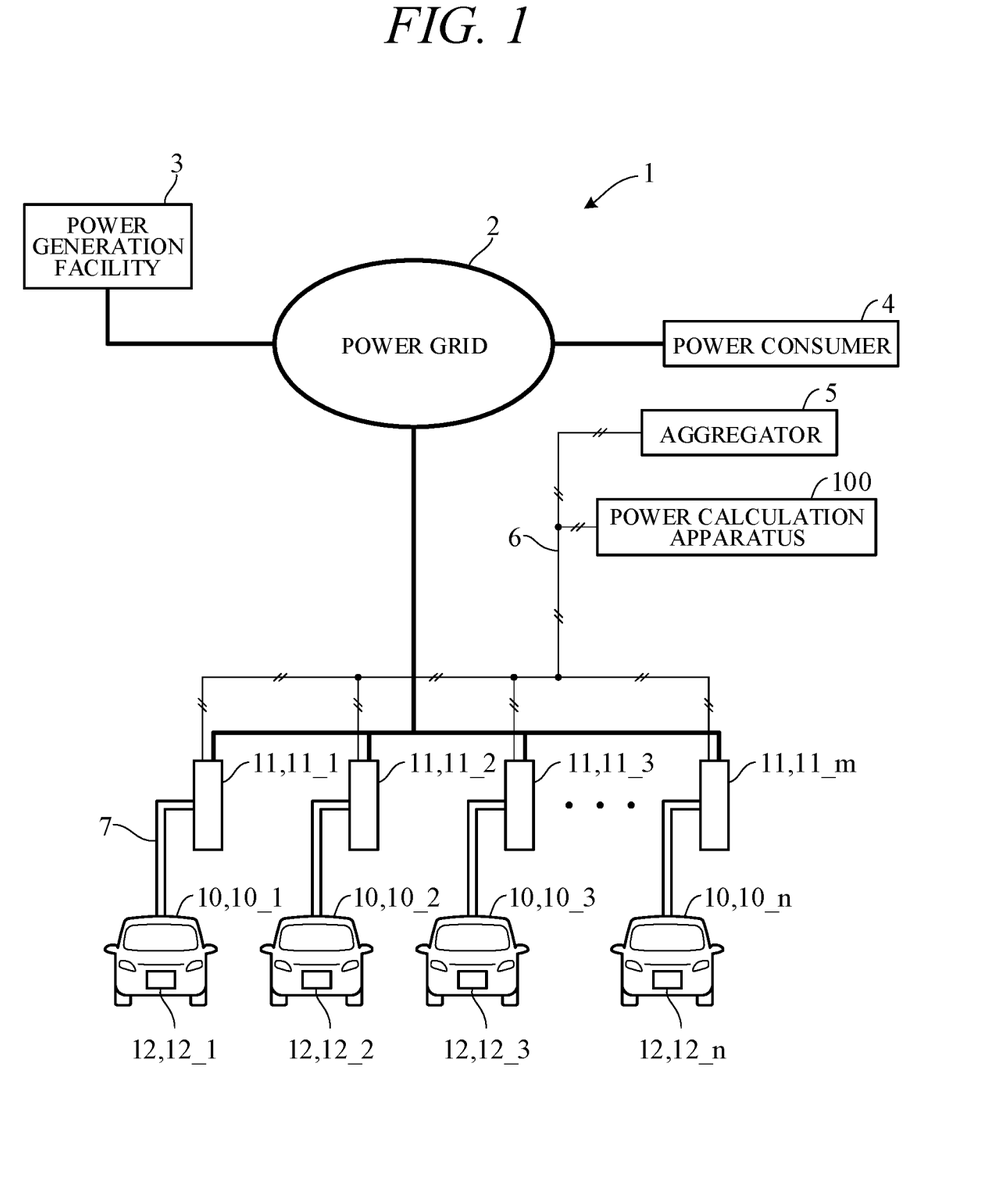
FIG. 1 is a diagram schematically showing a power system to which a power calculation apparatus according to an embodiment of the present invention is applied.

FIG. 1 schematically illustrates a power system including the V2G system to which the power calculation apparatus according to the present embodiment is applied. As illustrated in FIG. 1, a power system 1 to which a power calculation apparatus 100 is applied includes a power grid 2, a power generation facility 3 for supplying generated power to the power grid 2, and a power consumer 4 such as factories or various facilities supplied with power from the power grid 2.

The power system 1 also includes EVs 10_1 to 10_n each transfer power between the EV 10 and the power grid 2, and pieces of connection equipment (electric vehicle supply equipment as abbreviated to EVSE) 11_1 to 11_m each interposed between the power grid 2 and the corresponding EV 10. The power system 1 further includes a server device (hereinafter, referred to as an aggregator) 5 for centrally managing power for input and output between the power grid 2 and each EV 10.

A battery 12 is mounted on each of the EVs 10_1 to 10_n. The power calculation apparatus 100 is disposed between the pieces of EVSE 11 and the aggregator 5. As illustrated in FIG. 1, the power calculation apparatus 100, each piece of EVSE 11, and the aggregator 5 are connected via a wired or wireless communication network 6 and are communicable with each other.

Each piece of EVSE 11 and the corresponding EV 10 can be connected by a charging cable 7. Each piece of EVSE 11 and the corresponding EV 10 are capable of power transfer therebetween via the charging cable 7. In the present embodiment, each piece of EVSE 11 supplies power supplied from the power grid 2 to the corresponding EV 10 to charge the battery mounted on the EV 10. Each piece of EVSE 11 also supplies power from the corresponding EV 10 to the power grid 2 to make the battery mounted on the EV 10 function as one of the power storage facilities in the power grid 2.

Figure 2:
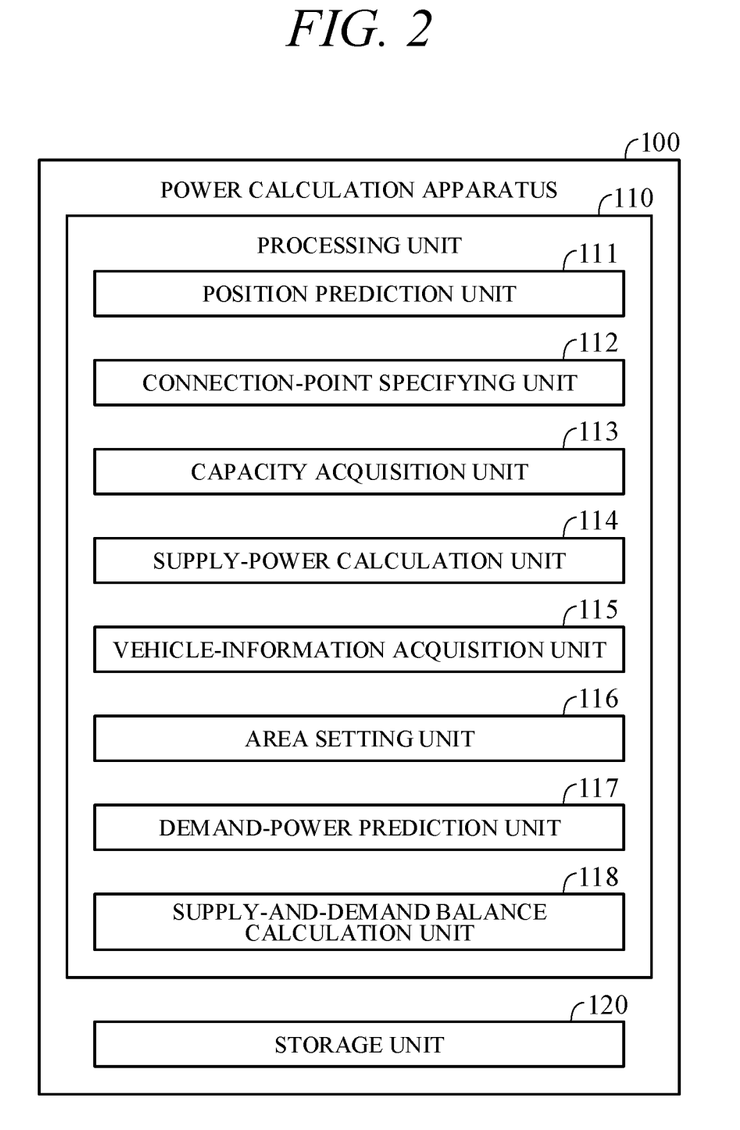
FIG. 2 is a diagram showing an exemplary functional configuration of the power calculation apparatus according to an embodiment of the present invention.

Next, the configuration of the power calculation apparatus 100 according to the present embodiment will be described. FIG. 2 is a diagram illustrating an exemplary functional configuration of the power calculation apparatus 100. As illustrated in FIG. 2, the power calculation apparatus 100 includes a processing unit 110 such as a central processing unit (CPU) (microprocessor), read only memory (ROM), random access memory (RAM), and a memory (storage unit) 120 such as a hard disk. The processing unit 110 executes a program stored in the storage unit 120 to function as a position prediction unit 111, a connection-point specifying unit 112, a capacity acquisition unit 113, a supply-power calculation unit 114, a vehicle-information acquisition unit 115, an area setting unit 116, a demand-power prediction unit 117, and a supply-and-demand balance calculation unit 118.

The position prediction unit 111 predicts the position of an EV 10 at a predetermined point in time in the future (hereinafter, it may be simply referred to as a predetermined point in time).

The connection-point specifying unit 112 specifies the position of the connection point of a battery 12 in connection with the power system 1. The connection-point specifying unit 112 specifies the position of a piece of EVSE 11 currently in connection with the EV 10, as the position of the connection point of the battery 12 mounted on the EV 10.

The connection-point specifying unit 112 also predicts and specifies a connection point of a battery 12 that can be connected to the power system 1 at the predetermined point in time in the future. Hereinafter, "connection point of the battery mounted on the EV" may be simply referred to as "connection point of the EV".

The capacity acquisition unit 113 acquires, as capacity information, battery-remaining-capacity information indicating the remaining capacity of the battery 12 from the vehicle information of the EV 10 acquired by the vehicle-information acquisition unit 115. The battery-remaining-capacity information will be described below.

The supply-power calculation unit 114 calculates the amount of power suppliable to the power system 1 in an area within a predetermined range including the position of the connection point of the battery 12 in connection with the power system 1, that is, the position of the connection point of the EV 10 in connection with the piece of EVSE 11 (for example, an area AR within a predetermined range R1 in FIG. 4 described below, or areas AR1 and AR2 within a predetermined range R2 in FIG. 5 described below).

The vehicle-information acquisition unit 115 acquires vehicle information from the EV 10. The vehicle-information acquisition unit 115 acquires, as the vehicle information, battery-remaining-capacity information and vehicle position information indicating the position of the vehicle. The vehicle-information acquisition unit 115 also acquires action plan information indicating an action plan of the vehicle, as the vehicle information. As described above, the vehicle-information acquisition unit 115 also functions as an action-plan-information acquisition unit.

Note that the power calculation apparatus 100 is communicable with the EV 10 via a wireless communication network (not illustrated) and the vehicle-information acquisition unit 115 acquires the vehicle information from the EV 10 via the wireless communication network. In the present embodiment, it is assumed that the vehicle-information acquisition unit 115 acquires the vehicle information from the EV 10 at a predetermined cycle.

The area setting unit 116 changes the range of the area within the predetermined range in accordance with the distribution status of the geographical locations of the EVs 10 each on which the battery 12 are mounted.

The demand-power prediction unit 117 predicts the amount of demand power in the area within the predetermined range.

The supply-and-demand balance calculation unit 118 calculates a value indicating the supply-and-demand balance of the area within the predetermined range, based on the amount of suppliable power calculated by the supply-power calculation unit 114 and the amount of demand power predicted by the demand-power prediction unit 117.

Figure 3:
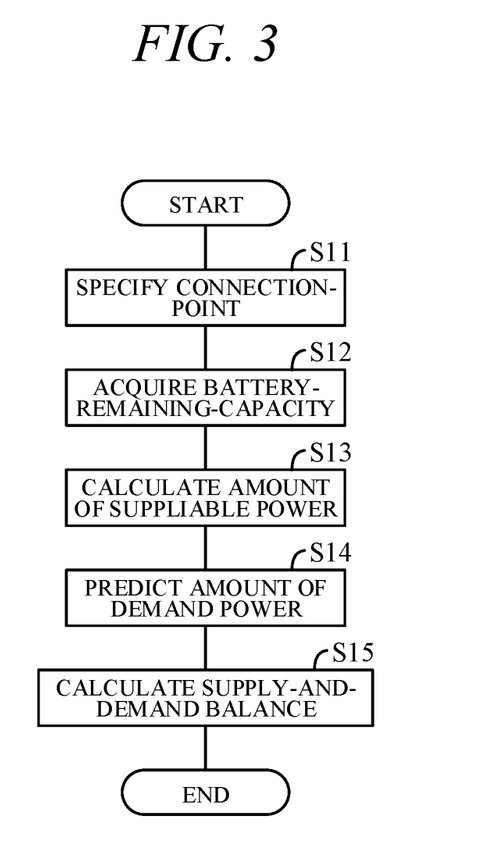
FIG. 3 is a flowchart showing an exemplary operation of the power calculation apparatus according to an embodiment of the present invention.

Next, the operation of the power calculation apparatus 100 according to the present embodiment will be described. FIG. 3 is a flowchart illustrating an exemplary operation of the power calculation apparatus 100. For example, in response to the reception, from the aggregator 5, of a command for requesting the calculation of the amount of suppliable power at the present point in time, the power calculation apparatus 100 performs the processing illustrated in FIG. 3.

First, in Step S11, the connection-point specifying unit 112 specifies the position of a piece of EVSE 11 in connection with an EV 10, as the position of the connection point of the battery 12 mounted on the EV 10. Note that it is assumed that the connection-point specifying unit 112 can acquire, from a piece of EVSE 11 via the communication network 6, the position information of the piece of EVSE 11 and information indicating the connection or non-connection of an EV 10.

Note that the connection-point specifying unit 112 may specify the position of the EV 10 from the vehicle position information included in the vehicle information acquired from the EV 10 at the predetermined cycle by the vehicle-information acquisition unit 115 for specifying the specified position as the position of the connection point of the battery 12 of the EV 10 in connection with to the power system 1.

Next, in Step S12, the capacity acquisition unit 113 acquires the battery-remaining-capacity information of the battery 12 of the EV 10. More specifically, the capacity acquisition unit 113 acquires battery-remaining-capacity information from the vehicle information of the EV 10 acquired from the EV 10 by the vehicle-information acquisition unit 115 in the predetermined cycle.

Next, in Step S13, based on the positions of the connection points of the on-vehicle batteries 12_1 to 12_n in connection with the power system 1 specified in Step S11 and the battery-remaining-capacity information of the batteries 12_1 to 12_n acquired in Step S12, the supply-power calculation unit 114 calculates the amount of power suppliable by an on-vehicle battery 12 to the power system in the area within the predetermined range including the connection points.

Here, the supply-power calculation unit 114 calculates the battery remaining capacity of each battery 12 at the present point in time indicated by the battery-remaining-capacity information (hereinafter, also referred to as the stored-energy remaining capacity) as the amount of power suppliable by the battery 12 to the power system in the area within the predetermined range including the connection point.

The relationship between a connection point and a predetermined range will now be described with reference to FIG. 4. FIG. 4 explanatorily illustrates the relationship between the connection point and the predetermined range. In FIG. 4, the area AR represents an area within the predetermined range R1 including the position of the EV 10_1, that is, the connection point of the battery 12_1. D1 and D2 represent power consumers such as factories. The area AR includes seven EVs 10 including the EV 10_1. Thus, the power of the respective on-vehicle batteries 12 of the seven EVs 10 in the area AR is suppliable to the power consumers D1 and D2 in the area AR.

In Step S12, the capacity acquisition unit 113 acquires the battery-remaining-capacity information of the batteries 12 of the seven EVs 10. Then, in Step S13, the supply-power calculation unit 114 calculates, based on the battery-remaining-capacity information acquired from the seven EVs 10, the amount of power suppliable by the batteries 12 of the seven EVs 10 to a power system in the area AR within the predetermined range R1.

Figure 4:
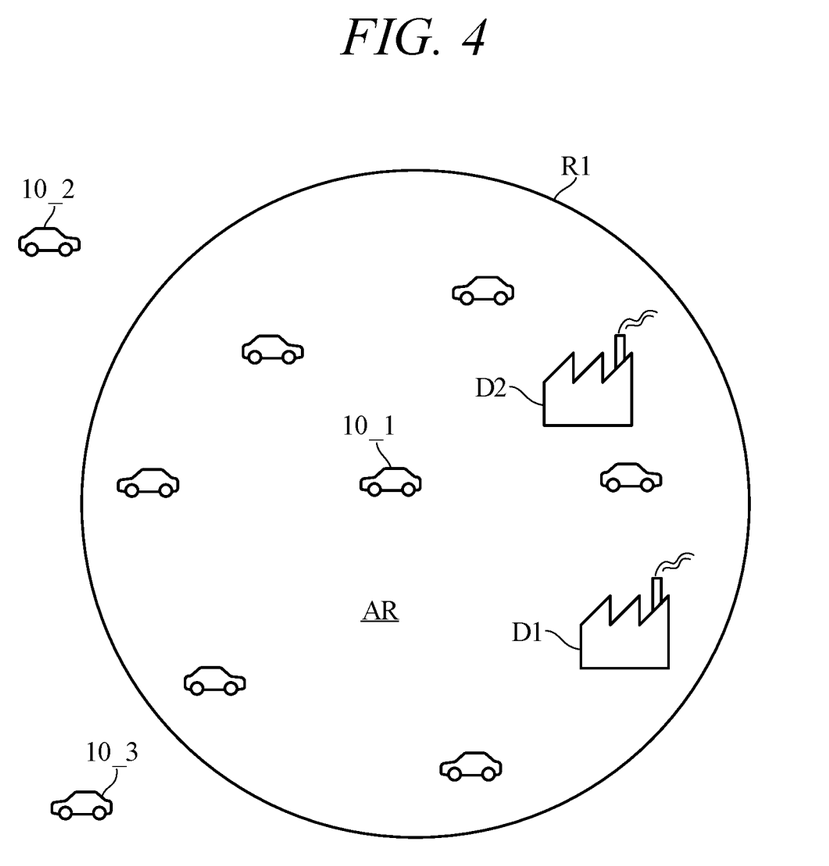
FIG. 4 is a diagram explanatorily showing a relationship between a connection point and a predetermined range.
Figure 5:
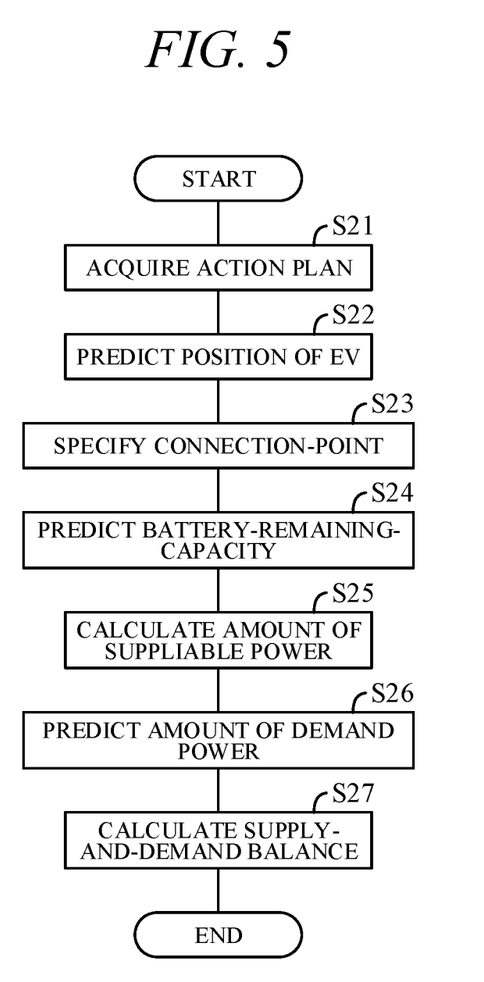
FIG. 5 is a flowchart showing another exemplary operation of the power calculation apparatus according to an embodiment of the present invention.

However, in FIG. 4, the EVs 10_2 and 10_3 are not included within the predetermined range R1, and thus the EVs 10_2 and 10_3 are not subjected to the processing in Steps S12 and S13. Therefore, the battery remaining capacities of the batteries 12 of the EVs 10_2 and 10_3 are not included in the amount of suppliable power calculated by the supply-power calculation unit 114. Next, in Step S14, the demand-power prediction unit 117 predicts the amount of demand power in the area AR within the predetermined range R1. Note that the aggregator 5 is in connection with the electric power company managing the power generation facility 3 by a communication network (not illustrated), and acquires information related to the amount of surplus power and the amount of shortage power via the communication network. The demand-power prediction unit 117 acquires, from the aggregator 5, information related to the amount of shortage power acquired by the aggregator 5, and predicts the amount of demand power in the area AR within the predetermined range R1. Note that another method may be used for predicting the amount of demand power by the demand-power prediction unit 117.

Finally, in Step S15, the supply-and-demand balance calculation unit 118 calculates a value indicating the supply-and-demand balance of the area AR within the predetermined range R1, based on the amount of suppliable power calculated in Step S13 and the amount of demand power predicted in Step S14.

Next, there will be described the operation of the power calculation apparatus 100 according to the present embodiment in calculation of the amount of suppliable power of an on-vehicle battery 12 at a predetermined point in time in the future. FIG. 5 is a flowchart illustrating another exemplary operation of the power calculation apparatus 100. For example, in response to the reception, from the aggregator 5, of a command for requesting the calculation of the amount of suppliable power at the predetermined point in time in the future, the power calculation apparatus 100 performs the processing illustrating in FIG. 5.

First, in Step S21, the vehicle-information acquisition unit 115 acquires the action plan information from each EV 10. Next, in Step S22, the position prediction unit 111 predicts the position of the EV 10 at the predetermined point in time, from the action plan information acquired by the vehicle-information acquisition unit 115.

Next, in Step S23, the connection-point specifying unit 112 specifies the position of the EV 10 at the predetermined point in time predicted by the position prediction unit 111, as the position of the connection point of the on-vehicle battery 12 of the EV 10 in connection with the power system 1 at the predetermined point in time. Next, in Step S24, the capacity acquisition unit 113 predicts the battery remaining capacity of the on-vehicle battery 12 of the EV 10 at the predetermined point in time.

Figure 6:
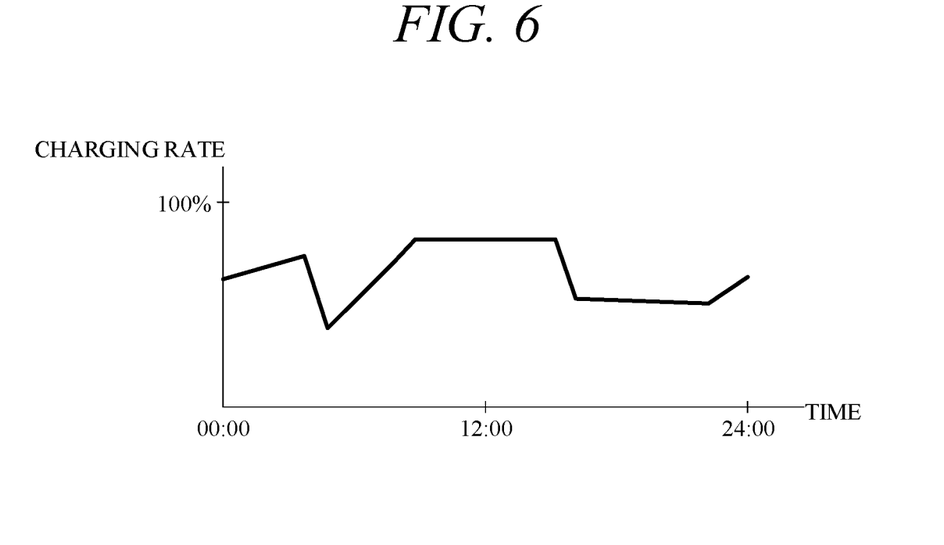
FIG. 6 is a graph showing exemplary battery-remaining-capacity information.

The battery-remaining-capacity information and the prediction of the battery remaining capacity will now be described. FIG. 6 is a graph illustrating exemplary battery-remaining-capacity information. The battery-remaining-capacity information is information in which the battery remaining capacity of an EV 10 in each time zone is recorded. The battery-remaining-capacity information may include the value of the battery remaining capacity at the present point in time, or as illustrated in FIG. 6, may include information in which the mean value of the battery remaining capacities in the past predetermined period (for example, past one week, past one month) is recorded in each time zone. Note that in the example illustrated in FIG. 6, the battery remaining capacity is represented by the charging rate; however, the battery remaining capacity may be represented by another parameter.

The capacity acquisition unit 113 acquires the battery remaining capacity at the predetermined point in time as a prediction value, from the battery-remaining-capacity information. For example, in acquisition of the battery remaining capacity at the predetermined point in time as the prediction value, from such battery-remaining-capacity information as illustrated in FIG. 6, when the present time is 12:00 and the predetermined point in time is 12:30, the capacity acquisition unit 113 acquires the battery remaining capacity at 12:30 from the battery-remaining-capacity information. Note that the method of predicting the battery remaining capacity at the predetermined point in time is not limited to the above, and thus another method may be used.

Next, in Step S25, based on the position of the connection point of the on-vehicle battery 12 in connection with the power system 1 specified in Step S23 and the battery-remaining-capacity information of the on-vehicle battery 12 predicted in Step S24, the supply-power calculation unit 114 calculates the amount of power suppliable to the power system 1 in the area within the predetermined range including the connection point of the battery 12 in connection with the power system 1 at the predetermined point in time.

The processing in Steps S26 and S27 are similar to those in Steps S14 and S15, and thus the description thereof will be omitted. Note that in Step S26, the amount of demand power at the predetermined point in time in the area within the predetermined range is predicted, and in Step S27, a value indicating the supply-and-demand balance at the predetermined point in time in the area within the predetermined range is calculated.

Figure 7:
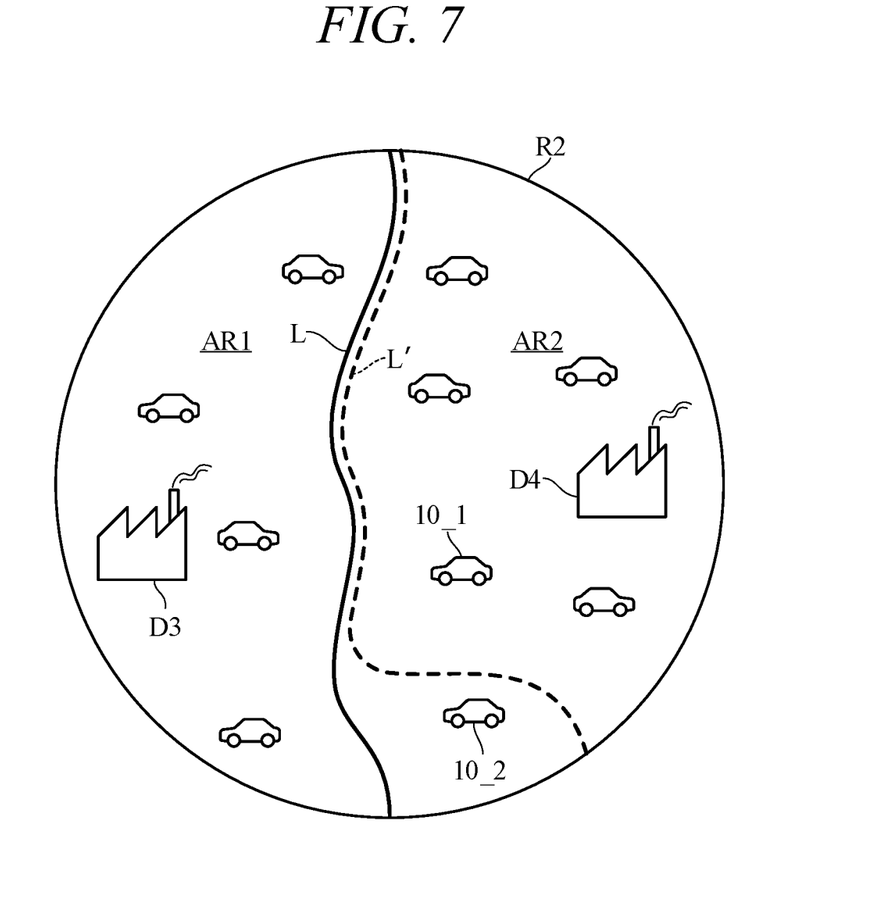
FIG. 7 is a diagram conceptually showing a change of a range of an area by an area setting unit.

Finally, the change of the range of an area by the area setting unit 116 will be described. FIG. 7 conceptually illustrates the change of the range of the area by the area setting unit 116.

In FIG. 7, ten EVs 10 including the EV 10_1 are included in the predetermined range R2. The predetermined range R2 also includes the AR1 and the AR2. The area AR1 includes four EVs 10 and the area AR2 includes six EVs 10. The areas AR1 and AR2 also include electric power consumers D3 and D4, respectively. The boundary L indicates a boundary between the areas AR1 and AR2.

Note that as illustrated in FIG. 7, in a case where a plurality of areas is included in a predetermined range, the power calculation apparatus 100 calculates the amount of power suppliable to the power system for each area.

In the example illustrated in FIG. 7, in order to uniform the distribution status of the geographical locations of the EVs 10, the area setting unit 116 changes the boundary between the areas from the boundary L to the boundary L' such that the EV 10_2 is included in the area AR1.

In addition, the area setting unit 116 may move any of the EVs 10 so as to uniform the distribution status of the geographical locations of the EVs 10. For example, the area setting unit 116 transmits, to the user (driver) of the EV 10_1, information including a notification for prompting connection to a piece of EVSE 11 provided in the area AR1 via the wireless communication network (not illustrated) for moving the EV 10_1 into the area AR1. At this time, a reward may be given to the user who has moved the EV 10_1 into the area AR1.

Note that the area setting unit 116 may set the boundary between the areas or may move any of EVs 10 so as to maintain the supply-and-demand balance in each area, based on other than the distribution status of the geographical locations. For example, based on the battery remaining capacities of the on-vehicle batteries 12 of the EVs 10 in each area, the area setting unit 116 may set the boundary between the areas or may move any of the EVs 10 so as to maintain the supply-and-demand balance in each area.

According to the embodiment of the present invention, the following functions and effects can be obtained.

(1) A power calculation apparatus 100 that calculates an amount of power suppliable to a power system 1 by a battery 12 connectable, at a connection point, to the power system 1 and capable of power transfer between the battery 12 and the power system 1, includes: a connection-point specifying unit 112 configured to specify a position of the connection point of the battery 12 in connection with the power system 1, a capacity acquisition unit 113 configured to acquire capacity information indicating a remaining capacity of the battery 12; and a supply-power calculation unit 114 configured to calculate the amount of power suppliable by the battery 12 to the power system 1 in an area within a predetermined range including the connection point, based on the capacity information acquired by the capacity acquisition unit 113 and the position of the connection point specified by the connection-point specifying unit 112.

Thus, the amount of power suppliable to the power system in the area within the predetermined range is calculated for an EV located within the predetermined range. As a result, the amount of power suppliable from the EV to the power system in the area within the predetermined range can be calculated accurately.

(2) The power calculation apparatus 100 further includes: a demand-power prediction unit 117 configured to predict an amount of demand power in the area within the predetermined range; and a supply-and-demand balance calculation unit 118 configured to calculate a value indicating a supply-and-demand balance in the area within the predetermined range, based on a difference between the amount of power calculated by the supply-power calculation unit 114 and the amount of demand power predicted by the demand-power prediction unit 117. Thus, the supply-and-demand balance in the area within the predetermined range can be determined accurately.

(3) The battery 12 serves as an on-vehicle battery 12 mounted on a vehicle. The power calculation apparatus 100 further includes: an action-plan-information acquisition unit (vehicle-information acquisition unit) 115 configured to acquire action plan information from the EV 10. The connection-point specifying unit 112 specifies, based on the action plan information acquired by the action-plan-information acquisition unit (vehicle-information acquisition unit) 115, a position where the EV 10 is located at a predetermined point in time in future as the position of the connection point. Thus, the amount of power suppliable from the EV to the power system in the area within the predetermined range at the predetermined point in time in the future can be calculated accurately.

(4) An area setting unit 116 changes a range of the area within the predetermined range in accordance with a distribution status of geographical locations of a plurality of the EVs on which a plurality of the on-vehicle batteries 12 is mounted one-to-one. Thus, the supply-and-demand balance in the area is maintained more favorably.

(5) The predetermined range is a range in which an amount of power loss that occurs in transmission of the power supplied from the battery 12 to the power system 1 via the power system 1 is a predetermined value or less. As described above, setting the predetermined range in consideration of the amount of power loss in the power transmission enables calculating more accurately the amount of power suppliable to the power system in the area within the predetermined range. Note that the predetermined range may be set by determination of the amount of power loss based on a distance over which the power is transmitted, or may be set by determination of the amount of power loss based on another parameter.

The above embodiment may be modified variously. Such modifications will be described below. There has been exemplified in the above embodiment that one aggregator 5 is provided in the power system 1. However, in a case where a plurality of aggregators is provided in a power system and the aggregators manage one-to-one EV groups different from each other, a power management apparatus may be disposed between each aggregator and the corresponding EV group.

In addition, there has been exemplified in the above embodiment that the power calculation apparatus 100 is provided outside the aggregator 5. A power calculation apparatus, however, may be provided inside an aggregator.

In the present this embodiment, the whole of the battery remaining capacity of an on-vehicle battery 12 is used to calculate the amount of suppliable power. However, in a case where the user provides the power of the on-vehicle battery 12 to the power system 1 via a piece of EVSE at a remote location, it is assumed that the user provides the power of the on-vehicle battery 12 while leaving the power of a predetermined capacity necessary enough to return home. Thus, a value obtained by subtracting a predetermined capacity from the battery remaining capacity of an on-vehicle battery may be used in Step S13.

In addition, there has been exemplified in the above embodiment that the on-vehicle battery 12 as a mobile battery is connected to the power grid 2. However, the mobile battery connected to the power grid 2 is not limited to such an on-vehicle battery.

There has been further exemplified in the present embodiment that the EVs 10_1 to 10_n are in connection with the aggregator 5. An aggregator, however, may be in connection with a fixed battery fixed and provided to a house or the like, such as a battery for storing power by solar power generation.

In addition, the aggregator 5 may be in connection with an energy source capable of storing power, such as an on-vehicle battery, or may be in connection with an energy source capable of generating power, such as an engine generator or a solar generator.

Here, there will be described that operation of, when a generator of a stationary type or mobile type as one of such energy sources capable of generating power is in connection with a power grid 2, a power calculation apparatus 100 calculates the amount of suppliable power of the generator in the present point in time.

First, a connection-point specifying unit 112 specifies the position where such a generator is provided, as the position of the connection point of the generator in connection with a power system 1 at a predetermined point in time. It is assumed that information related to the position where the generator is provided is stored in advance in a storage unit 120. Then, the connection-point specifying unit 112 specifies the connection point of the generator at the predetermined point in time from the position information stored in the storage unit 120. Note that in a case where the generator has a global positioning system (GPS) function or the like, the connection-point specifying unit 112 may acquire information related to the position of the generator from the generator via wireless communication.

Next, a capacity acquisition unit 113 acquires, from the generator, power-generation-capacity information indicating the power-generation capacity of the generator, as capacity information. Here, it is assumed that the power calculation apparatus 100 and the generator are in connection with each other via a wireless communication network and the capacity acquisition unit 113 acquires the power-generation-capacity information via the wireless communication network. In addition, it is assumed that the power-generation-capacity information includes at least a value of the power-generation capacity at the present point in time.

Then, a supply-power calculation unit 114 calculates the amount of power suppliable by the generator to the power system in an area within a predetermined range including the connection point, based on the position of the connection point of the generator and the power-generation capacity thereof.

Note that in a case where as the power-generation-capacity information, information similar to battery-remaining-capacity information, that is, information in which the power-generation capacity of the generator in each time zone is recorded can be acquired from the generator, and the position of the generator in the predetermined point in time in the future can be predicted, processing similar to Steps S22 to S25 is preformed, so that the amount of power suppliable by the generator to the power system in the area within the predetermined range including the connection point at the predetermined point in time in the future can also be calculated.

Note that use of the mean value of the capacities of power, as power-generation-capacity information, that generators each can generate on a time basis and that is acquired in advance also enables calculating the amount of power suppliable by each of the generators to the power system in the area within the predetermined range including the connection point of each of the generators at the predetermined point in time in the future.

An area setting unit 116 may change the range of an area in consideration of the distribution status of the geographical locations of the generators. That is, the area setting unit 116 may move a mobile generator together with an on-vehicle battery or instead of the on-vehicle battery so as to maintain the supply-and-demand balance in each area.

Such a configuration enables calculating, for a generator located within a predetermined range, the amount of power suppliable to the power system in the area within the predetermined range. As a result, the amount of power suppliable from the generator to the power system in the area within the predetermined range can also be calculated accurately. In addition, inclusive of the generator located within the predetermined range, the amount of power suppliable to the power system in the area within the predetermined range can be calculated. Thus, even in a case where a battery and the generator are located within the predetermined range, the supply-and-demand balance in the area within the predetermined range can be determined accurately.

The above embodiment can be combined as desired with one or more of the above modifications. The modifications can also be combined with one another.

According to the present invention, the amount of power suppliable to a power system can be calculated accurately.

Above, while the present invention has been described with reference to the preferred embodiments thereof, it will be understood, by those skilled in the art, that various changes and modifications may be made thereto without departing from the scope of the appended claims.

What is claimed is:

1. A power calculation apparatus, comprising:
 a microprocessor and a memory connected to the microprocessor, wherein the microprocessor is configured to perform calculating an amount of power suppliable to a power system by an energy source connectable, at a connection point, to the power system and capable of power generation and power storing, the calculating comprising:
  specifying a position of the connection point of the energy source in connection with the power system;
  acquiring capacity information indicating a power generation capacity or a remaining storage capacity of the energy source; and
  calculating the amount of power suppliable by the energy source to the power system in an area within a predetermined range including the connection point, based on the capacity information and the position of the connection point.

2. The power calculation apparatus according to claim 1, wherein
the microprocessor is configured to further perform
predicting an amount of demand power in the area within the predetermined range; and
calculating a value indicating a supply-and-demand balance in the area within the predetermined range, based on a difference between the amount of power and the amount of demand power.

3. The power calculation apparatus according to claim 1, wherein
the energy source serves as an on-vehicle battery mounted on a vehicle, and
the microprocessor is configured to further perform
acquiring action plan information from the vehicle, wherein
the specifying the position of the connection point includes specifying, based on the action plan information, a position where the vehicle is located at a predetermined point in time in the future as the position of the connection point.

4. The power calculation apparatus according to claim 3, wherein
the microprocessor is configured to further perform
changing a range of the area within the predetermined range in accordance with a distribution status of geographical locations of a plurality of the vehicles on which a plurality of the on-vehicle batteries are mounted.

5. The power calculation apparatus according to claim 4, wherein
the microprocessor is configured to perform
the calculating the amount of power including calculating, when the energy source is the on-vehicle battery, the amount of power suppliable from the on-vehicle battery to the power system after subtracting the predetermined capacity from the remaining storage capacity of the on-vehicle battery indicated by the capacity information.

6. The power calculation apparatus according to claim 1, wherein
the predetermined range is a range in which an amount of power loss occurring in a transmission of the power supplied from the energy source to the power system is a predetermined value or less.

7. The power calculation apparatus according to claim 1, wherein
the microprocessor is configured to perform
the calculating the amount of power including predicting the power generation capacity or the remaining storage capacity of the energy source at a predetermined point in time in future based on the capacity information to calculate the amount of power suppliable from the energy source to the power system at the predetermined point in time in future based on the power generation capacity or the remaining storage capacity and the position of the connection point.

8. A power calculation apparatus, comprising:
a microprocessor and a memory connected to the microprocessor, wherein the microprocessor is configured to calculate an amount of power suppliable to a power system by an energy source connectable, at a connection point, to the power system and capable of power generation and power storing, and to function as:

a connection-point specifying unit configured to specify a position of the connection point of the energy source in connection with the power system;
a capacity acquisition unit configured to acquire capacity information indicating a power generation capacity or a remaining storage capacity of the energy source; and
a supply-power calculation unit configured to calculate the amount of power suppliable by the energy source to the power system in an area within a predetermined range including the connection point, based on the capacity information and the position of the connection point.

9. The power calculation apparatus according to claim 8, wherein
the microprocessor is configured to further function as
a demand-power prediction unit configured to predict an amount of demand power in the area within the predetermined range; and
a supply-and-demand balance calculation unit configured to calculate a value indicating a supply-and-demand balance in the area within the predetermined range, based on a difference between the amount of power and the amount of demand power.

10. The power calculation apparatus according to claim 8, wherein
the energy source serves as an on-vehicle battery mounted on a vehicle, and
the microprocessor is configured to further function as
a vehicle-information acquisition unit configured to acquire action plan information from the vehicle, wherein
the connection-point specifying unit specifies, based on the action plan information, a position where the vehicle is located at a predetermined point in time in future as the position of the connection point.

11. The power calculation apparatus according to claim 10, wherein
the microprocessor is configured to further function as
an area setting unit configured to change a range of the area within the predetermined range in accordance with a distribution status of geographical locations of a plurality of the vehicles on which a plurality of the on-vehicle batteries are mounted.

12. The power calculation apparatus according to claim 11, wherein
the supply-power calculation unit calculates, when the energy source is the on-vehicle battery, the amount of power suppliable from the on-vehicle battery to the power system after subtracting the predetermined capacity from the remaining storage capacity of the on-vehicle battery indicated by the capacity information.

13. The power calculation apparatus according to claim 8, wherein
the predetermined range is a range in which an amount of power loss occurring in a transmission of the power supplied from the energy source to the power system is a predetermined value or less.

14. The power calculation apparatus according to claim 8, wherein
the supply-power calculation unit predicts the power generation capacity or the remaining storage capacity of the energy source at a predetermined point in time in future based on the capacity information to calculate the amount of power suppliable from the energy source to the power system at the predetermined point in time in future based on the power generation capacity or the remaining storage capacity and the position of the connection point.

15. A power calculation method, comprising:
calculating an amount of power suppliable to a power system by an energy source connectable, at a connection point, to the power system and capable of power generation and power storing, wherein the calculating comprises:
   specifying a position of the connection point of the energy source in connection with the power system;
   acquiring capacity information indicating a power generation capacity or a remaining storage capacity of the energy source; and
   calculating the amount of power suppliable by the energy source to the power system in an area within a predetermined range including the connection point, based on the capacity information and the position of the connection point.

\* \* \* \* \*